US00RE35867E

United States Patent [19]

Sugiyama

[11] E Patent Number: Re. 35,867

[45] Reissued Date of Patent: Aug. 4, 1998

[54] METHOD AND APPARATUS FOR CONTROLLING COEFFICIENTS OF ADAPTIVE FILTER

[75] Inventor: Akihiko Sugiyama, Tokyo, Japan

[73] Assignee: NEC Corporation, Japan

[21] Appl. No.: 453,152

[22] Filed: May 30, 1995

Related U.S. Patent Documents

Reissue of:

[64] Patent No.: 5,329,472
Issued: Jul. 12, 1994
Appl. No.: 143,239
Filed: Oct. 22, 1993

U.S. Applications:

[63] Continuation of Ser. No. 839,303, Feb. 20, 1992, abandoned.

[30] Foreign Application Priority Data

Feb. 20, 1991 [JP] Japan ..... 3-049002
Jul. 9, 1991 [JP] Japan ..... 3-195882

[51] Int. Cl.[6] ..... G06F 17/10

[52] U.S. Cl. ..... 364/724.19

[58] Field of Search ..... 364/724.19, 724.2

[56] References Cited

U.S. PATENT DOCUMENTS 4,349,889 9/1982 van den Elzen et al. ..... 364/724.2
4,773,034 9/1988 Debus, Jr. ..... 364/724.2
4,789,994 12/1988 Randall et al. ..... 364/724.2
4,791,390 12/1988 Harris et al. ..... 364/724.19
4,811,360 3/1989 Potter ..... 364/724.2
4,989,170 1/1991 Batruni et al. ..... 364/724.19
5,058,047 10/1991 Chung ..... 364/724.19
5,168,459 12/1992 Hiller ..... 364/724.19

FOREIGN PATENT DOCUMENTS 0023056 1/1981 European Pat. Off. .
0098748 1/1984 European Pat. Off. .
0176312 4/1986 European Pat. Off. .

OTHER PUBLICATIONS

"A Fast Convergence Algorithm For Adaptive Fir Filters", Akihiko Sugiyama et al., Institute of Electrical and Electronics Engineers, May 23–26, 1989, vol. 2, pp. 892–895.

*Primary Examiner*—David H. Malzahn
*Attorney, Agent, or Firm*—Ostrolenk, Faber, Gerb & Soffen, LLP

[57] ABSTRACT

A method or apparatus for controlling coefficients of an adaptive filter (3) for identifying unknown system or predicting periodic signals by correcting coefficients of the adaptive filter (3) in such a manner that the difference signal obtained by subtracting an output signal of the adaptive filter (3) from a mixed signal of the output signal from the unknown system and an interference signal comprises steps or means (9) for obtaining the information relating to the magnitude of the coefficients or output of the adaptive filter, and adaptively varying the amount of correction in coefficients of the adaptive filter in response to the obtained information.

19 Claims, 12 Drawing Sheets

METHOD AND APPARATUS FOR CONTROLLING COEFFICIENTS OF ADAPTIVE FILTER

Matter enclosed in heavy brackets [ ] appears in the original patent but forms no part of this reissue specification; matter printed in italics indicates the additions made by reissue.

This is a continuation of application Ser. No. 07/839,303 filed on Feb. 20, 1992, now abandoned.

BACKGROUND OF THE INVENTION

The present invention relates to a method and apparatus for controlling coefficients of an adaptive filter for identifying an unknown system or predicting periodic signals using such adaptive filter, wherein interference signals are superimposed with the output signal from the unknown system. Practical applications of this method and apparatus include noise cancellers to eliminate noise mixed with a signal from a main input terminal, echo cancellers to eliminate undesired reflection signals acoustically coupled to a microphone from a speaker or mismatching of 2-line to 4-line conversion circuit, line equalizers to equalize distortion caused by transmission lines and adaptive line enhancers to pick up periodic signals buried in a wideband signal or to suppress periodic interference signals in a wideband signal.

In identifying unknown systems or predicting periodic signals using an adaptive filter, noise cancellers and adaptive line enhancers (referred to as ALE hereunder) are known as typical examples where strong interference signals are superimposed with an output signal from an unknown system. See p.p. 1692–1716 of the PROCEEDINGS OF IEEE, 1975; Vol. 63, No. 12 (referred to as the Reference 1 hereunder). Also known are echo cancellers as disclosed in the IEEE JOURNAL ON SELECTED AREAS IN COMMUNICATIONS, 1984, Vol. 2, No. 2 at p.p. 283–297 (referred to as the Reference 2 hereunder). In echo cancellers, if double talk is not detected properly, the near-end signal acts as a strong interference signal. No double talk detection is made in echo cancellers to be used in 2-line bidirectional transmission. In this case, additional noise superimposed in the transmission lines will be a weak interference signal to the adaptive operation of the filter.

A noise canceller suppresses noise in the signal by applying a noise replica corresponding to the noise components in the main input terminal. Used for this end is an adaptive filter having a transfer function similar to the impulse response of the noise path from the noise source to the main input terminal. At this time, a coefficient for each tap of the adaptive filter is successively modified by correlating the reference noise derived at the reference input terminal with a difference signal obtained by subtracting the noise replica from the mixed signal of the noise and the signal.

On the other hand, an echo canceller suppresses the echo by subtracting a pseudo echo or an echo replica from the echo signal caused by mismatching of the 2-line to 4-line conversion circuit in a 2-line bidirectional transmission line or a long distance telephone line or acoustical coupling between a microphone and a speaker. The echo replica is generated by using an active filter having a transfer function similar to the impulse response of the echo path. A coefficient of each tap at the adaptive filter is successively modified by correlating the reference signal at the reference input terminal with a difference signal obtained by subtracting the echo replica from the mixed signal of the echo signal and the additional noise.

Used in ALEs is an adaptive filter having a transfer function to pass only signal components whose periods are equal to those of the periodic signals for enhancing the periodic signals buried in a wideband signal. A coefficient of each tap of the adaptive filter for this application is a prediction coefficient to predict the periodic signals. It is successively modified by correlating the difference signal obtained by subtracting the predicted periodic signals or the output from the adaptive filter from the mixed signal of the periodic signals and the wideband signal on the main input terminal with the delayed mixed signal on the reference input. For enhancing the periodic signals, the output from the adaptive filter is used as the ALE output and the ALE is also used to suppress periodic interference signal to the wideband signal. In the latter case, the output signal is the difference or error signal instead of the output from the adaptive filter.

There are two typical coefficient modifications or converging algorithms. One is an LMS algorithm (see the Reference 1). The other is a Learning Identification Method (LIM) as set forth in p.p. 282–287 of The IEEE Transactions on Automatic Control, Vol. 12, No. 3 in 1967 (referred to as Reference 3 hereunder).

Illustrated In FIG. 14 is a block diagram of a conventional noise canceller. A mixed signal of a signal and noise detected on a main input terminal 1 is supplied to a subtracter 4. On the other hand, supplied to an adaptive filter 3 is a reference noise detected on a reference input terminal 2. The noise components are cancelled by the subtracter 4 which subtracts the noise replica generated by the adaptive filter 3 from the mixed signal. The subtracted output is supplied to an output terminal 6. Simultaneously, the output of the subtracter 4 is supplied to a multiplier 5 to be multiplied by the coefficient $2\alpha$ to be used for correcting the coefficient of the adaptive filter 3. Here, $\alpha$ is a constant and $2\alpha$ is known as a step size. Let the signal, the reference noise, the noise to be cancelled and an additional noise to the signal be $S_k$ (k being an index to represent time), $n_k$, $V_k$ and $\delta_k$, respectively. The signal $u_k$ to be actually supplied to the subtracter 4 from the input terminal 1 is given by the following expression:

$$u_k=S_k+V_k+\delta_k \tag{1}$$

A purpose of the noise cancellers is to generate the noise replica $V_k$ of the noise components $v_k$ in the above expression (1) for cancelling the noise. The noise replica $V_k$ is adaptively generated by using a closed loop comprising the adaptive filter 3, the subtracter 4 and the multiplier 5 in FIG. 14. The closed loop provides the difference or error signal $d_k$ given by the following expression as the output signal from the subtracter 4. However, it is to be noted that $\delta_k$ is sufficiently small as compared to $S_k$ and is neglected in the expression:

$$d_k=S_k+v_k-V_k \tag{2}$$

In the above expression (2), $(v_k-V_k)$ is known as a residual noise. In the LMS algorithm, the m-th coefficient $C_{m,k}$ of the adaptive filter 3 is corrected in accordance with the following expression:

$$C_{m,k}+C_{m,k-1}+2\alpha\cdot d_k\cdot n_{m,k-1} \tag{3}$$

A matrix format of the expression (3) for all of the N coefficients is as follows:

$$C_k=C_{k-1}+2\alpha\cdot d_k\cdot n_{k-1} \tag{4}$$

Where, $C_k$ and $n_k$ are given by the following expressions, respectively:

$$C_k=[C_0C_1 \ldots C_{N-1}]^T \quad (5)$$

$$n_k=[n_kn_{k-1} \ldots n_{K-N+1}]^T \quad (6)$$

Here, $[.]^T$ represents a transposition of the matrix. On the other hand, in the LIM algorithm, correction of coefficients will be carried out in accordance with the following expression (7) rather than the expression (4).

$$C_k=C_{k-1}+(2\mu/N\sigma n^2)\cdot d_k\cdot n_{k-1} \quad (7)$$

$\mu$ in the above expression (7) is the step size for LIM and $\sigma_n^2$ represents an average power of the input to the adaptive filter 3. $\sigma_n^2$ is used to make the step size $\mu$ counter proportional to the average power for stable convergence. There are a few methods to calculate $\sigma_n^2$. One example is to calculate in accordance with the following expression (8):

$$\sigma_n^2=\sum_{j=0}^{N-1} n_{k-j}^2 \quad (8)$$

The step sizes in the above expressions (4) and (7) define the converging speed of the adaptive filter and the residual noise level after convergence. In case of the LMS algorithm, if the value of $\alpha$ is larger, the convergence speed is faster but the final residual noise level increases. On the contrary, it is required to choose relatively small value of $\alpha$ in order to achieve a sufficiently low final residual noise level. However, this causes a relatively slow convergence speed. This is true of the step size $\mu$ in the LIM algorithm.

A VS algorithm has been proposed in order to meet the conflicting requirements in the step size to the converging speed and the final residual noise. See p.p. 309–316 of the IEEE Transactions on Acoustics, Speech and Signal Processing, 1986, Vol. 34, No. 2 (referred to as Reference 4 hereunder). The VS algorithm uses step size matrix 2A instead of the step size $2\alpha$ in the LMS algorithm as represented by the above expression (4). Each component of A is controlled in response to the progress in convergence of the adaptive filter. The use of individual step size given by the step size matrix A rather than a common step size for each coefficient allows optimum step size for each coefficient depending on variations in magnitude of the self-correlation matrix component, thereby improving the converging speed. Actual correction of the coefficients will be performed by the following expression:

$$C_k = C_{k-1} + 2A \cdot d_k \cdot n_{k-1} \quad (9)$$

$$A = [a_{ij}]$$

$$a_{ij} = 0 \quad \text{for } i \neq j$$

$$\neq 0 \quad \text{for } i = j$$

$a_{m,m}$ is determined by the successive pattern of the polarity sgn $[G_{m,k}]$ of the gradient component $G_{m,k}$ corresponding to the m-th tap, where $G_{m,k}$ is given by the following expression:

$$G_{m,k}=2\cdot\alpha_{m,m}\cdot d_k\cdot n_{m,k-1} \quad (10)$$

In an ideal case where $d_k=v_k-V_k$, the polarity of $G_{m,k}$ directly represents the progress of convergence. However, $d_k$ is generally affected by $S_k$ as understood from the expression $d_k=S_k+v_k-V_k$. In order to reduce the influence of $S_k$, $a_{m,m}$ is halved if sgn $[G_{m,k}]$ changes $m_0$ times consecutively. On the other hand, it is doubled if sgn $[G_{m,k}]$ are equal for $m_1$ times consecutively. That is, the VS algorithm features to make equivalently $S_k+v_k-V_k \propto v_k-V_k$ by detecting succession of identical polarities or successive alternations of the polarity. However, there is a certain limitation In the variable range of $a_{m,m}$. That is, the maximum value $\alpha_{max}=1/\lambda$ and the minimum value $\alpha_{min}$ is defined by a desired final residual noise. Here, $\lambda$ is the maximum inherent value of the autocorrelation matrix. The performance of the VS algorithm depends largely on the relationship between $S_k$ and $v_k-V_k$. The polarity changing pattern of the above $G_{m,k}$ is a function of the signal-to-noise ratio (SNR) and the spectrum of $S_k$. When the SNR is large, $|S_k|>|v_k-V_k|$ is almost always true and seriously affects polarity detection. Considering the fact that SNR is defined by the ratio of the signal and the noise in mathematical expectation of their instantaneous powers, $|S_k|>|v_k-V_k|$ is satisfied with a greater probability as $S_k$ contains more higher-frequency components even if SNR is low. In other words, when $S_k$ has many peaks and dips, it is most likely that $|S_k|$ is larger than $|v_k-V_k|$ in some of the peaks even if SNR is sufficiently low.

Illustrated in FIG. 15 is a block diagram of a conventional ALE corresponding to the noise canceller in FIG. 14. A mixed signal to be supplied to an input terminal 1 comprises a wideband signal $S_k$, a periodic signal $v_k$ and an additive noise $\delta_k$. On the other hand, supplied to an adaptive filter 3 is a delayed signal of the mixed signal on the input terminal 1 delayed by L by a delay element 8 and is given by:

$$u_{k-L}=S_{k-L}+V_{K-L} \quad (11)$$

However, $\delta_k$ is neglected in the above expression (11) because it is sufficiently small compared with $S_k$. The difference signal $d_k$ given by the expression (2) is obtained by subtracting the prediction signal $V_k$ of $v_k$ generated by the adaptive filter 3 from the mixed signal $u_k$ of the expression (1). Derived from an output terminal 6 is a wideband signal with suppressed periodic interference signals. Also derived from an output terminal 7 is the enhanced periodic signals obtained by suppressing wideband noise. Coefficient correction of the adaptive filter 3 should be carried out by using $(v_k-V_k)$ which is a prediction error of the periodic signals. However, the actually derived difference signal $d_k$ contains the wideband signal $S_k$. As a result, the above discussions on $|S_k|$ and $|v_k-V_k|$ in the noise canceller are also applicable to the ALE. That is, a correct step size control in the VS algorithm depends on the relationship between $|S_k|$ and $|v_k-V_k|$ and no correct step size is obtained if $|S_k|$ is larger than $|v_k-V_k|$.

Illustrated in FIG. 16 is a block diagram of a conventional echo canceller corresponding to the noise canceller in FIG. 14. The block diagrams in FIGS. 16 and 14 are identical to each other but differ only in input signals. Supplied to an input terminal 1 is a signal comprising an echo $V_k$ and an additive noise $\delta_k$.

$$u_k=v_k+\delta_k \quad (12)$$

On the other hand, supplied to an adaptive filter 3 is $n_k$ through an input terminal 2. $n_k$ represents an input signal to a 2-line to 4-line conversion transformer in case of a bidirectional transmission circuit or a signal to be supplied to a speaker in case of an echo due to acoustic coupling. An echo replica $V_k$ of $v_k$ generated by the adaptive filter 3 is subtracted from $u_k$ in the expression (12) derived from the input terminal 1 to obtain the difference signal $d_k$ in the following expression (13):

$$d_k=v_k-V_k+\delta_k \quad (13)$$

Derived from an output terminal 6 is the echo cancelled signal. Coefficient correction of the adaptive filter 3 should be performed using the residual echo ($v_k$–$V_k$). In practice, however, the additional noise $\delta_k$ is contained in the difference signal $d_k$. Although $\delta_k$ is fairly small in general, it interferes the residual echo when the residual echo becomes sufficiently small.

SUMMARY OF THE INVENTION

In order to minimize the effect of interference signals, it is required to increase both $m_0$ and $m_1$ and minimize $\alpha_{min}$. However, this will adversely make the advantage of the VS algorithm less attractive. Additionally, as understood from the expression (9), the VS algorithm requires that a large number of step sizes equal to the number of coefficients be stored in a memory, thereby requiring a large memory capacity as the number of taps increases and in turn making the hardware very expensive.

It is therefore an object of the present invention to provide a method and an apparatus for controlling coefficients of an adaptive filter with a shorter converging time and smaller scale of hardware.

According to the present invention there is provided a method or apparatus for controlling coefficients of an adaptive filter for identifying an unknown system and predicting periodic signals by correcting coefficients of the adaptive filter in such a manner that the difference signal is obtained by subtracting an output signal of the adaptive filter from a mixed signal consisting of the output signal from the unknown system and an interference signal. The present invention includes an apparatus and method for obtaining the information relating to the magnitude of the coefficients or output of the adaptive filter, and adaptively varying the amount of correction in coefficients of the adaptive filter according to the obtained information.

The coefficient control method and apparatus for an adaptive filter according to the present invention reduces converging time by controlling the magnitude of the step size by using the fact that the absolute values of coefficients of the adaptive filter increase and saturate as the coefficients converge. Since the absolute values of coefficients depend on the transfer function of the path to be identified, such dependency can be avoided by using the ratio of the long-time and short-time averages in the average value of the coefficients. Since the absolute value of the coefficients as well as the average value of the absolute signal output from the adaptive filter saturate to a constant value, the converging time can be reduced by controlling the step size using the information relating to the magnitude of the filter output signal instead of the information relating to the magnitude of the filter coefficients.

DETAILED DESCRIPTION OF THE PREFERRED EMBODIMENTS

Figure 1:
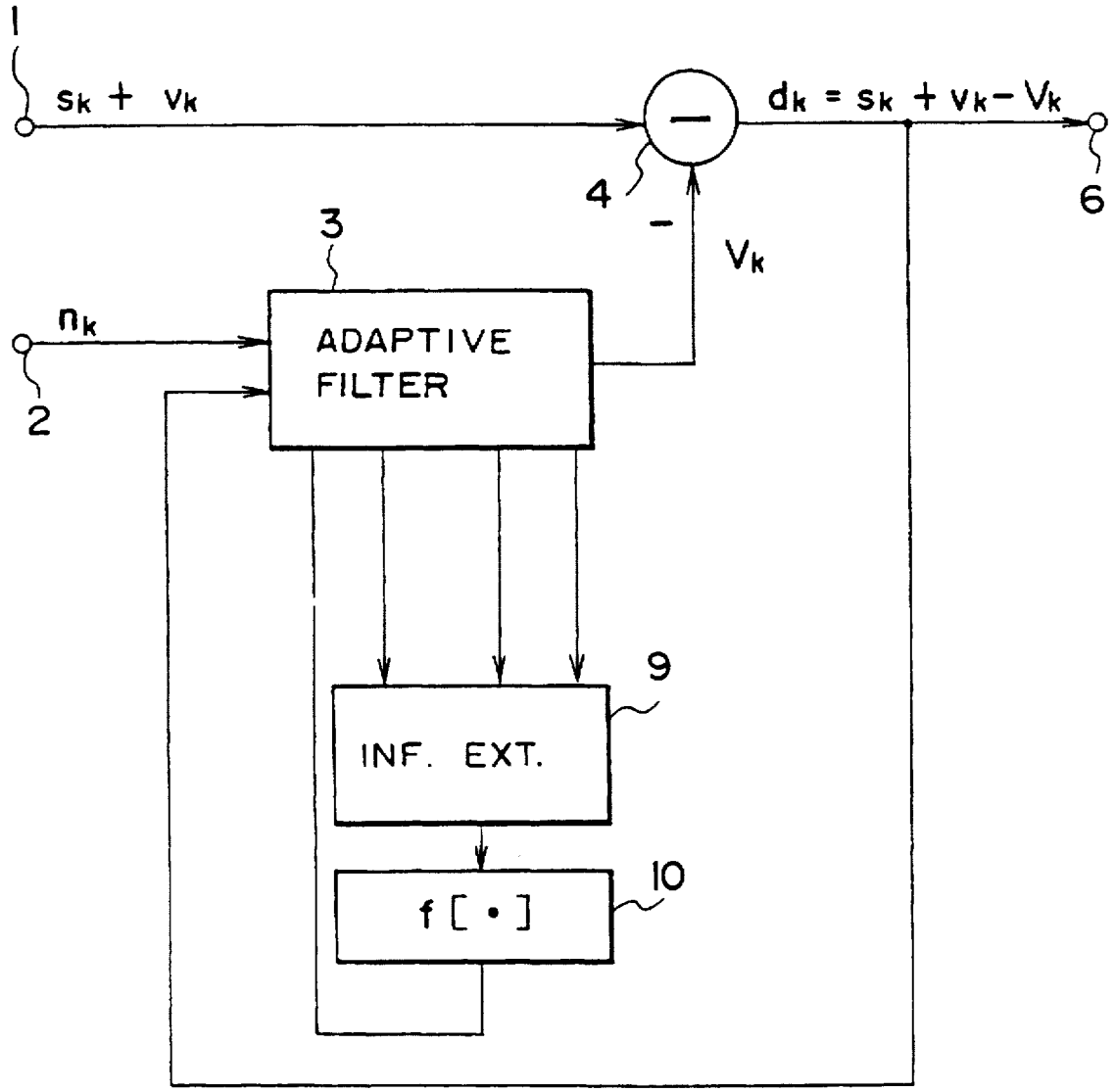
FIG. 1 is a block diagram of one embodiment of the present invention.
Figure 14:
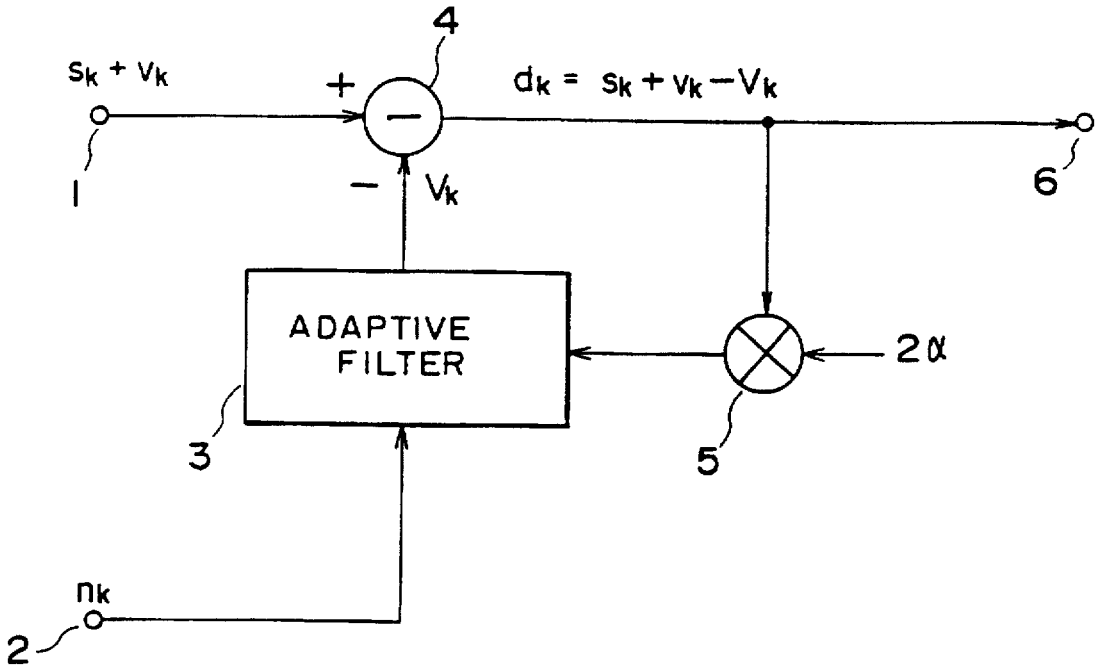
FIG. 14 PRIOR ART
FIG. 14 is a block diagram of a conventional noise canceller.
Figure 15:
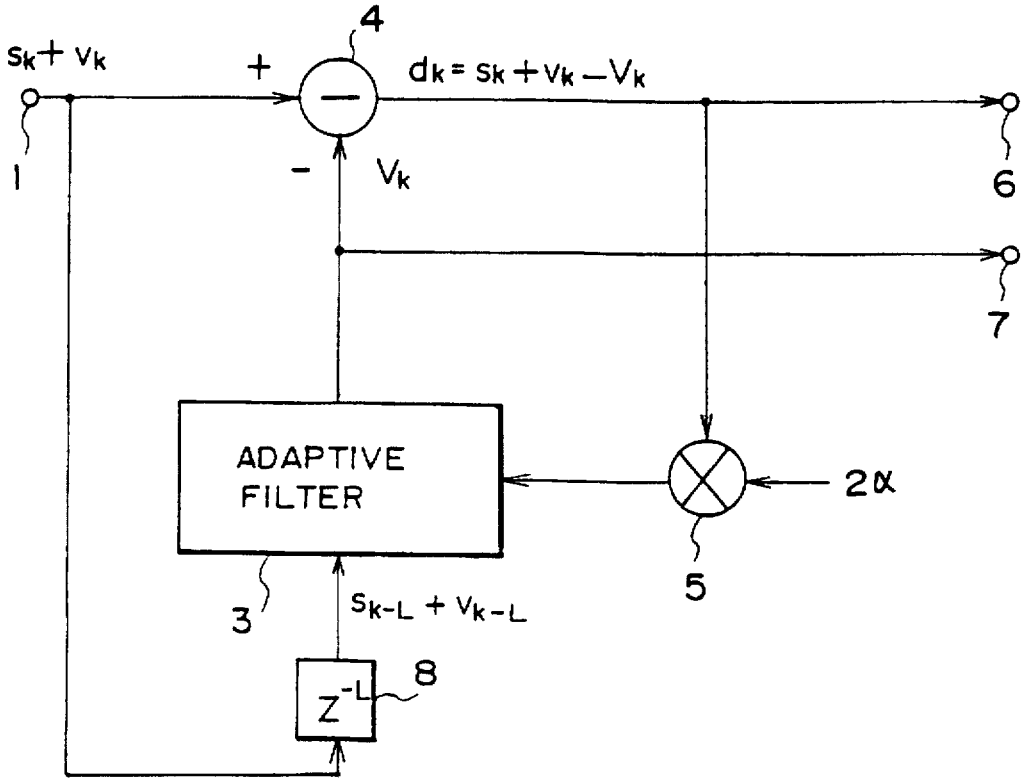
FIG. 15 PRIOR ART
FIG. 15 is a block diagram of a conventional ALE corresponding to the noise canceller in FIG. 14.
Figure 16:
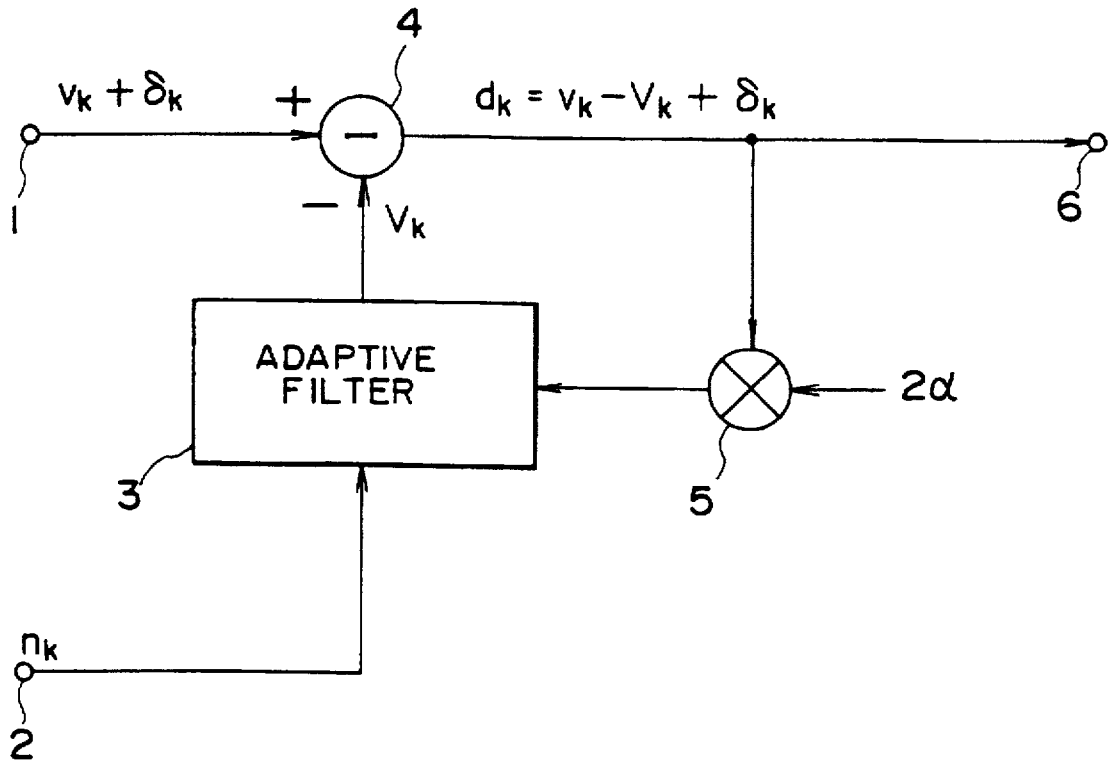
FIG. 16 PRIOR ART
FIG. 16 is a block diagram of a conventional echo canceller corresponding to the noise canceller in FIG. 14.

The present invention will be described in detail hereunder by reference to the accompanying drawings. Illustrated in FIG. 1 is a block diagram of one embodiment of the present invention. In FIG. 1, the same reference numerals as those in FIG. 14 are used to refer like functional blocks. A primary difference between FIGS. 1 and 14 is in the magnitude of the step size. That is, the step size $2\alpha$ to be supplied to the multiplier 5 in FIG. 14 is fixed but varies in FIG. 1 in response to the magnitude of coefficients for the adaptive filter. For this end, there is employed an information extraction circuit 9 to extract the information relating to the magnitude of coefficients. Also employed in FIG. 1 is an arithmetic circuit 10 for controlling the step size using the extracted information.

By reference to FIG. 1, supplied to the information extraction circuit 9 are the adaptive filter coefficients from the adaptive filter 3. The information extraction circuit 9 extracts the information relating to the magnitude of coefficients for supplying to the arithmetic circuit 10. The arithmetic circuit 10 performs arithmetic operation as defined by b=f[a] based on the signal a to be supplied from the information extraction circuit 9 and the output is supplied to the adaptive filter 3.

Figure 2:
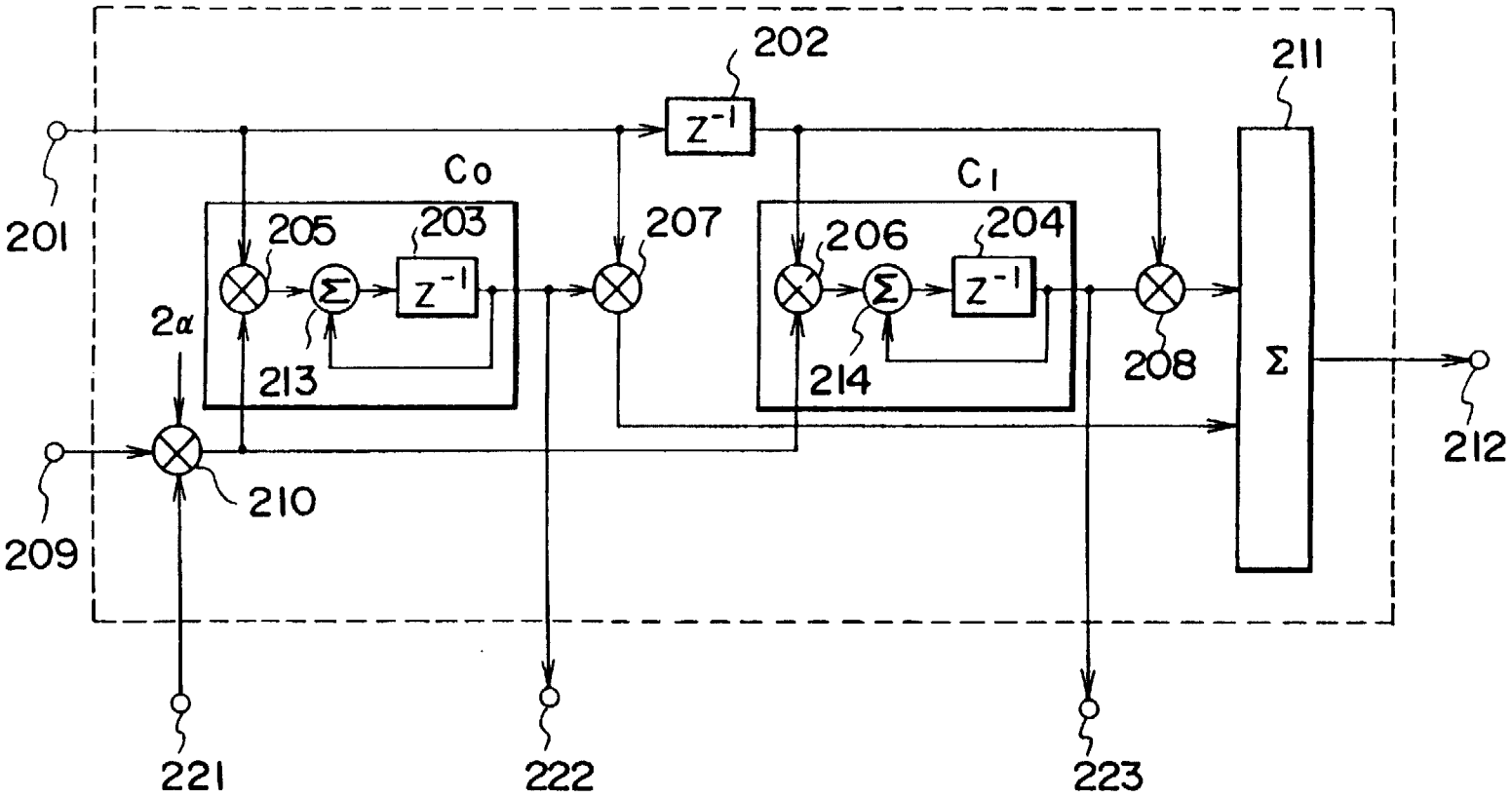
FIG. 2 is a detailed schematic of the adaptive filter 3 in FIG. 1.

Illustrated in FIG. 2 is a detailed block diagram of the adaptive filter 3 in FIG. 1. For convenience, it is assumed that the adaptive filter 3 has only 2 taps. An input signal from the input terminal 2 in FIG. 1 is supplied to an input terminal 201 in FIG. 2. Also, supplied to an input terminal 209 is the output from the subtracter 4 in FIG. 1, or the error signal. The output signal on an output terminal 212 is supplied to the subtracter 4 as the output of the adaptive filter 3 in FIG. 1. Both signals from output terminals 222 and 223 are supplied to the information extraction circuit 9. The output signal of the arithmetic circuit is supplied to an input terminal 221.

The input signal to be supplied to the input terminal 201 is supplied to a delay element 202 and multipliers 205 and 207. The input signal on the input terminal 201 is also supplied to multipliers 206 and 208 after a delay equivalent to one sampling period. In other words, the signals to be supplied to the multipliers 205–206 and 207–208 have a time difference equal to one sampling period. Now, the input signal sample to be supplied to the input terminal 201 at time kT (T representing the sampling period) is represented as $n_k$. $n_k$ and $n_{k-1}$ are supplied to the multipliers 205–207 and 206–208, respectively. On the other hand, let $d_k$ and $y_k$ be the error signal supplied to a multiplier 210 from the input terminal 209 and the signal supplied to the multiplier 210 from the arithmetic circuit 10 by way of the input terminal 221, respectively. Then, the output from the multiplier 210 is equal to $2\alpha \cdot y_k \cdot d_k$. The output of the multiplier 210 is multiplied by the input signals $n_k$ and $n_{k-1}$ in the multipliers 205 and 206 before being transferred to adders 213 and 214, respectively. That is, the signals to be supplied to the adders 213 and 214 are $2\alpha \cdot y_k \cdot d_k \cdot n_k$ and $2\alpha \cdot y_k \cdot d_k \cdot n_{k-1}$, respectively. Fedback respectively to the adders 213 and 214 are the outputs from delay elements 203 and 204, respectively. The outputs from the delay elements 203 and 204 are coefficients for the adaptive filter 3 and are represented by $C_{0,k}$ and $C_{1,k}$ at respective time kT. Then, the added outputs transmitted to the delay elements 203 and 204 from the adders 213 and 214 will be $C_{0,k}+2\alpha \cdot y_k \cdot d_k \cdot n_k$ and $C_{1,k}+2\alpha \cdot y_k \cdot d_k \cdot n_{k-1}$, respectively. These signals are delayed by one sampling period because of the delay elements 203 and 204. Therefore, $$C_{0,k+1}=C_{0,k}+2\alpha \cdot y_k \cdot d_k \cdot n_k \tag{14}$$

$$C_{1,k+1}=C_{1,k}+2\alpha \cdot y_k \cdot d_k \cdot n_{k-1} \tag{15}$$

$C_{0,k}$ and $C_{1,k}$ are supplied to the output terminals 214 and 215 respectively for step size control.

Figure 3:
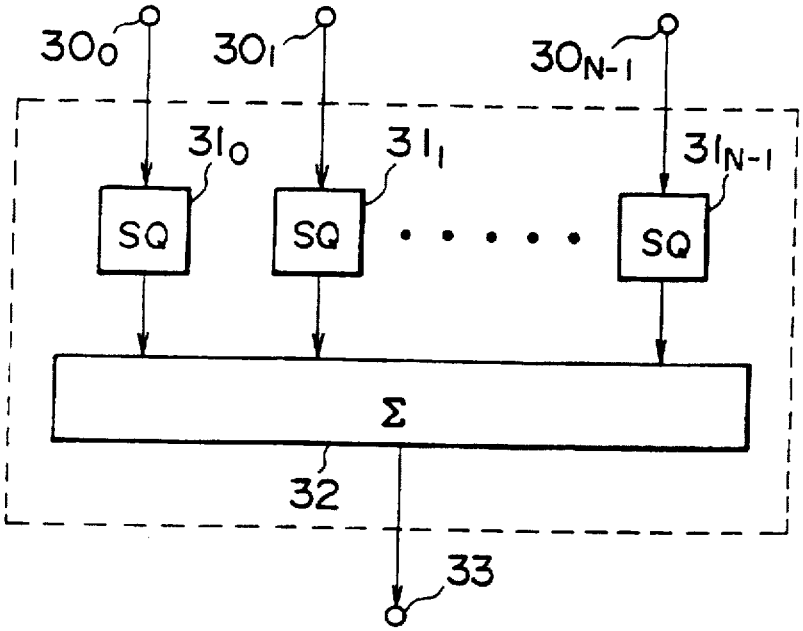
FIG. 3 is a first example of an information extraction circuit 9.

Illustrated in FIG. 3 is a block diagram of a first example of the information extraction circuit 9, wherein a squared value of the coefficient is used as the information relating to the magnitude of the coefficients of the adaptive filter. Supplied to input terminals $\mathbf{30}_0, \mathbf{30}_1, \ldots, \mathbf{30}_{N-1}$ are N coefficients from the adaptive filter 3. It is to be noted here that N is the number of taps of the adaptive filter 3. N=2 is the particular example of the adaptive filter 3 in FIG. 2. The signals supplied to the input terminals $\mathbf{30}_0, \mathbf{30}_1, \ldots, \mathbf{30}_{N-1}$ are squared by respective squaring circuits $\mathbf{31}_0, \mathbf{31}_1, \ldots, \mathbf{31}_{N-1}$ to be supplied to a multi-input adder 32. The multi-input adder 32 provides the sum of the squared values to be derived from its output terminal 33. Referring to the description for FIG. 2, the signal $a_k$ derived from the output terminal 33 is given by the following expression:

$$a_k=\sum_{j=0}^{N-1} C_{j,k}^2 \tag{16}$$

Figure 4:
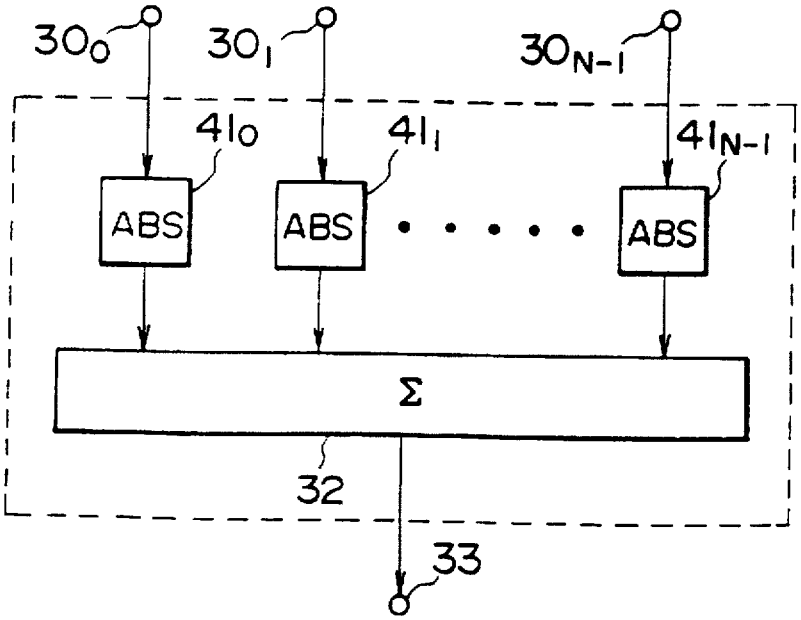
FIG. 4 is a second example of an information extraction circuit 9.

Illustrated in FIG. 4 is a block diagram of a second example of the information extraction circuit 9, wherein absolute values of the coefficients are used as the information relating to the magnitude of the coefficients of the adaptive filter. It is to be noted that the absolute value of each coefficient saturates as adaption of the adaptive filter coefficients progresses, thereby saturating the sum of the absolute values. Accordingly, the absolute values can be used as a measure to determine the degree of convergence. That is, the step size can be controlled by the sum of the absolute values of the filter coefficients instead of the squared values thereof. Supplied to the input terminals $\mathbf{30}_0, \mathbf{30}_1, \mathbf{30}_2, \ldots, \mathbf{30}_{N-1}$ are N coefficients from the adaptive filter 3, which are then converted into the corresponding absolute values by absolute value circuits $\mathbf{41}_0, \mathbf{41}_1, \ldots, \mathbf{41}_{N-1}$ before being supplied to the multi-input adder 32. The multi-input adder 32 operates to provide from its output terminal 33 the sum of the absolute values $a_k$ which is given by the following expression:

$$a_k=\sum_{j=0}^{N-1} |C_{j,k}| \tag{17}$$

For simplicity, a description is given hereunder for a case where $a_k$ is defined by the expression (16).

The obtained $a_k$ is supplied to the arithmetic circuit 10 which calculates and provides an output $b_k$ in accordance with the definition $b_k=f[a_k]$. The calculated output $b_k$ is fed to the adaptive filter 3 by way of the input terminal 213. Therefore, $$y_k=f\left[\sum_{j=0}^{N-1} C_{j,k}^2\right] \tag{18}$$

The equations (14), (15) are basically the same as the equation (3). Only the difference is the use of a variable step size $2\alpha \cdot y_k$ instead of the fixed step size $2\alpha$. A method of controlling $y_k$, i.e., how to calculate f[.] is an essential factor to achieve high-speed, stable convergence.

Figure 5:
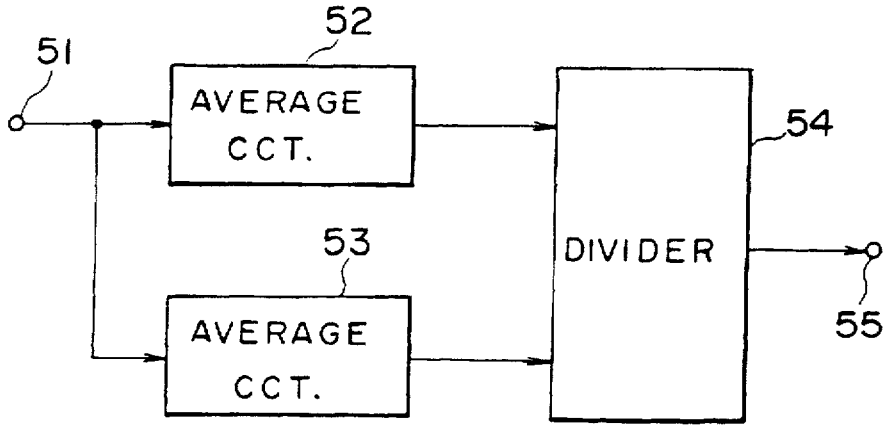
FIG. 5 is one example of an arithmetic circuit 10 to obtain $y_k$.

Illustrated in FIG. 5 is a block diagram of the arithmetic circuit 10 to obtain $y_k$. The input signal derived from the input terminal 51 is fed to both averaging circuits 52, 53. That is, the inputs to the averaging circuits 52, 53 are $a_k$ or the output from the information extraction circuit 9. The averaging circuit 52 calculates a short-time-constant moving average $\underline{a}_k$ of the input signal while the averaging circuit 53 calculates a long-time-constant moving average $[a_k]$ of the input signal. The outputs $u_k$ and $z_k$ from the averaging circuits 52 and 53 are given by the following expressions, respectively:

$$u_k=f\left[\sum_{j=0}^{N-1} C_{j,k}^2\right] \tag{19}$$

$$z_k=\sum_{j=0}^{N-1} C_{j,k}^2 \tag{20}$$

The divider 54 calculates the ratio of $u_k$ and $z_k$ to provide on its output terminal 55 $y_k$ given by the following expression:

$$y_k=\frac{z_k}{u_k}=\frac{\sum_{j=0}^{N-1} C_{j,k}^2}{\left[\sum_{j=0}^{N-1} C_{j,k}^2\right]} \tag{21}$$

Now, $a_k$ increases and saturates as k increases. The short-time average $\underline{a}_k$ increases faster than the long-time average $[a_k]$. As a result, it is understood that the ratio $y_k=\underline{a}_k/[a_k]$ decreases gradually from a value larger than 1 to converge ultimately to 1. This means that the signal $y_k$ to be supplied to the output terminal 55 from the divider 54 is relatively large Immediately after initiation of the coefficient correction but decreases gradually as the adaptive filter 3 continues its adaptation. Finally, it becomes equal to 1. The signal $y_k$ as obtained in the above manner is fed to the input terminal 213 in FIG. 2 as the output from the arithmetic circuit 10 in FIG. 1.

The use of this value $y_k$ multiplied by the fixed step-size in accordance with the equations (14) and (15) will make the effective step-size large initially and subsequently equal to the final value $2\alpha$ after convergence, thereby shortening the converging time.

Figure 6:
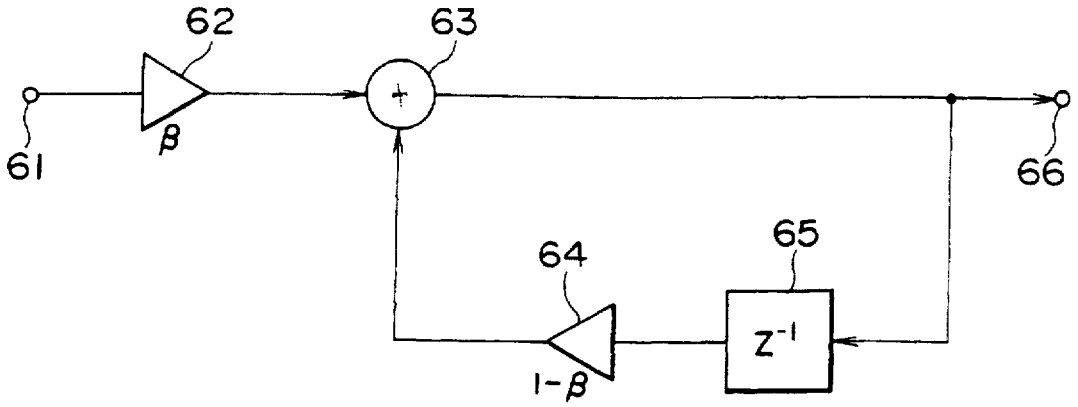
FIG. 6 is an example of the averaging circuit.

Illustrated in FIG. 6 is a block diagram of the averaging circuit which is known as a first-order leaky integrator with a leaky factor $\beta(0<\beta<1)$. A signal supplied to its input terminal 61 is multiplied by the factor of $\beta$ in an integrator 62 before being fed to an adder 63. The output from the adder 63 is fed to an output terminal 66 and also to a delay element 65. A delayed signal delayed by one clock period in the delay element 65 is multiplied by the coefficient of $1-\beta$ in a multiplier 64 before being fed to the adder 63. The adder 63 accumulates the signals fed to the input terminal 61 with 1 clock delay, thereby integrating the signals. At this time, "leak" will be caused in the multiplier 64. As understood from the values of the multipliers 62 and 64, when the signal fed to the input terminal 61 is relatively stationary, the output signal from the output terminal 66 increases gradually before saturating. By proper selection of the constant $\beta$, the saturation value can stimulate the average value of the input signal. If $\beta$ is small, $1-\beta$ is approximately 1 and the signal on the output terminal 66 is fed back to the adder 63 with no modification, thereby providing a moving averaging circuit of relatively long time constant. On the other hand, if $\beta$ is large, the feedback signal from the output terminal 66 to the adder 63 will be rapidly decreasing. This will increase the contribution of the current signal fed to the multiplier 62 from the input terminal 61, thereby shortening the time constant of the moving averaging circuit. Accordingly, it is understood that the averaging circuit as illustrated in FIG. 6 can be used for the averaging circuits 52 and 53 by proper selection of the leaky factor $\beta$. When the first-order leaky integrator in FIG. 6 is used for the averaging circuits 52 and 53, the leaky factors of the averaging circuits 52 and 53 are chosen respectively as $\beta_s$ and $\beta_1$ to obtain the following equations from the above equations (19) and (20):

$$u_k = \beta_1 \left( \sum_{j=0}^{N-1} C_{j,k}^2 \right) + (1-\beta_1) u_{k-1} \tag{22}$$

$$z_k = \beta_s \left( \sum_{j=0}^{N-1} C_{j,k}^2 \right) + (1-\beta_s) z_{k-1} \tag{23}$$

As a result, $y_k$ is expressed as follows:

$$y_k = \frac{\beta_s \left( \sum_{j=0}^{N-1} C_{j,k}^2 \right) + (1-\beta_s) Z_{k-1}}{\beta_1 \left( \sum_{j=0}^{N-1} C_{j,k}^2 \right) + (1-\beta_1) u_{k-1}} \tag{24}$$

Considering that $y_k$ is a decreasing function with $z_0=u_0=0$, the maximum value of $y_k$ is $y_1=\beta_s/\beta_1$ and is constant regardless of any external condition such as coefficients of the adaptive filter and the reference signals therefor. Although FIG. 6 illustrates an example of a recursive type averaging circuit, any other circuit configuration such as a transversal type may be used as well.

Figure 7:
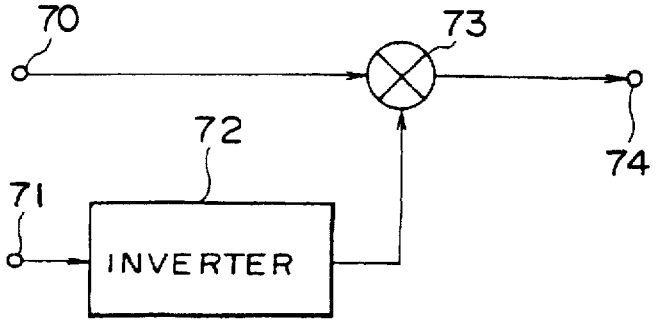
FIG. 7 is an example of the divider circuit 54.

Illustrated in FIG. 7 is a block diagram of the divider 54 comprising an inverter and a multiplier. The signals fed to the divider 54 in FIG. 5 from the averaging circuits 52 and 53 are fed to input terminals 70 and 71, respectively. The inverter 72 provides an inverse of the signal fed to the input terminal 71 to be transferred to the multiplier 73 where the inverse signal and the signal from the input terminal 70 are multiplied before being transferred to an output terminal 74. The product on the output terminal is fed to the output terminal 55 in FIG. 5.

Figure 8:
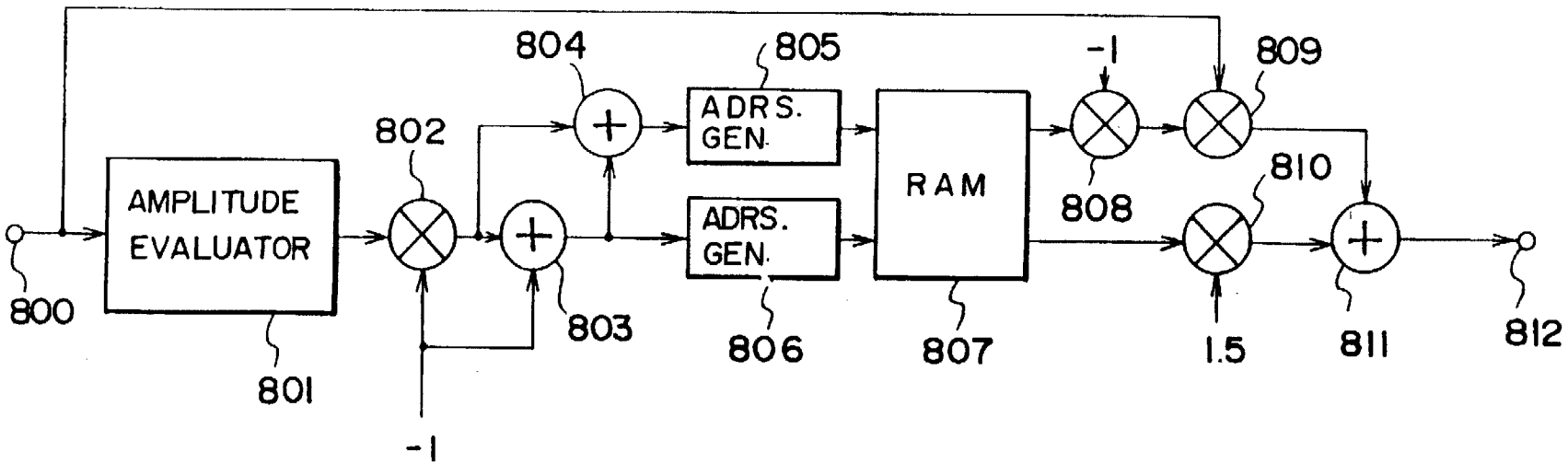
FIG. 8 is an example of the inverse circuit 32.

Illustrated in FIG. 8 is a block diagram of one example of the inverse circuit 32 to simulate the inverse calculation using exponent. Let a signal to be inverted be $p_k$ and the inverse $q_k=1/p_k$. $q_k$ may be approximated by the following linear equation:

$$q_k = -2^{-2r-1} p_k + 2^{-r-1}(2^{-1}+1) \tag{25}$$

Here, r is the largest integer not exceeding $\log_2(p_k)$. The equation (25) is simple to realize because it comprises exponent of 2 and additions and subtractions. The inverter in FIG. 8 operates as follows:

Applied to an input terminal 800 in FIG. 8 is the signal to be fed to the inverter 72 from the input terminal 71 in FIG. 7. The signal is fed to an amplitude evaluation circuit 801 and a multiplier 809. The amplitude evaluation circuit 801 calculates the maximum integer r not exceeding $\log_2(p_k)$ for the input signal $p_k$. The maximum integer r is fed to a multiplier 802 which is multiplied by $-1$ before being transmitted to adders 803 and 804. In the adder 803, $-1$ is added to the signal from the multiplier 802 to obtain $-r-1$ to be fed to an address generation circuit 806. Added to the signal from the multiplier 802 in the adder 804 is $-r-1$, or the output from the multiplier 803 to feed the resulting signal $-2r-1$ to the address generation circuit 805. The address generation circuits 805 and 806 generate respective addresses to a RAM 807 for obtaining from the RAM exponents of 2 corresponding to the fed signals. The RAM 807 supplies to a multiplier 802 $2^{-2r-1}$ corresponding to the address generation circuit 805 while $2^{-r-1}$ is supplied to a multiplier 810 in response to the address generation circuit 806. The multiplier 810 multiplies the signal fed from the RAM 807 by 1.5 before being fed to a multiplier 811. The adder 808 multiplies the signal fed from the RAM 807 by $-1$ before being fed to the multiplier 809. The signal $-2^{-2r-1}$ fed to the multiplier 809 is multiplied by the input signal $p_k$ fed from the input terminal 800 to be fed to the adder 811. The adder 811, then, adds the signal $-2^{-2r-1}p_{kk}$ from the multiplier 809 and the signal $1.5 \cdot 2^{-r-1}$ from the multiplier 810 to derive the resulting output $-2^{-2r-1} \cdot p_k + 1.5 \cdot 2^{-r-1}$ from an output terminal 812. The output signal from the output terminal 812 is the signal to be fed to the multiplier 73 in FIG. 7.

It is assumed so far that $a_k$ is defined by the equation (16), i.e., the sum of the squared values of filter coefficients is fed to the arithmetic circuit 10. However, it is to be understood that the descriptions also apply to $a_k$ defined by the equation (17), i.e., the sum of the absolute values of filter coefficients is fed to the arithmetic circuit 10. Also, similar descriptions hold true for adaptive filters having more than 2 taps.

Figure 9:
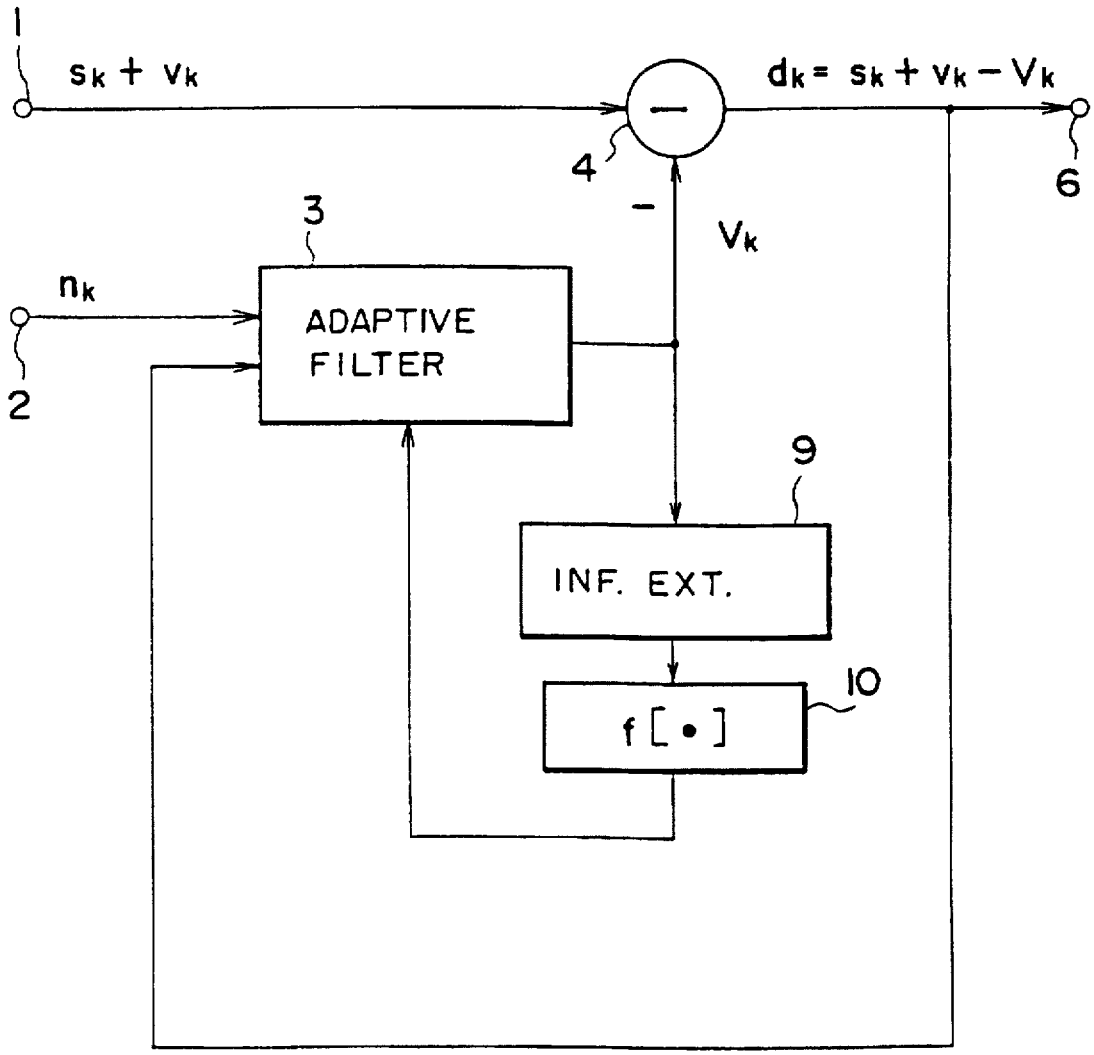
FIG. 9 is a block diagram of adaptively controlling the step size using the filter output.

Although the above descriptions are made on the step-size control using the sum of the squared values of the filter coefficients, it is to be understood that the step-size control may be made using the information relating to the magnitude of the filter output signal instead of the filter coefficients because the average values of the adaptive filter output in either absolute or squared values will saturate as well as the absolute values in the coefficients to a stationary or a pseudo stationary input signal. Illustrated in FIG. 9 is a block diagram for adaptively controlling the step size using the filter output. A difference from the embodiment as illustrated in FIG. 1 is in that the signal to be supplied to the information extraction circuit 9 is the output from the adaptive filter 3. As a result, there is only one input in the information extraction circuit 9. However, the same construction as illustrated in FIG. 3 or FIG. 4 may be used without any correction. When there are more than one input terminals in the information extraction circuit 9, either one of the terminals may be used to feed the output from the adaptive filter 3 thereto. Also, the adaptive filter 3 may be the same as illustrated in FIG. 2 with leaving the output terminals 214 and 215 unconnected.

When the first example in FIG. 3 is used as the information extraction circuit 9, the signal $a_k$ on the output terminal 33 will be expressed:

$$a_k = V_k^2 = \left( \sum_{j=0}^{N-1} C_{j,k} n_{k-j} \right)^2 = C_k^T n_k C_k^T n_k \tag{26}$$

On the contrary, when the second example in FIG. 4 is used as the information extraction circuit 9, the signal $a_k$ derived from the output terminal 33 will be expressed:

$$a_k = |V_k| = \left| \sum_{j=0}^{N-1} C_{j,k} n_{k-j} \right| = |C_k^T n_j| \tag{27}$$

For simplicity, in a case where $a_k$ is defined by the equation (26), the following equations will be obtained in corresponding to the equations (18) through (24):

$$y_k = f\left[ \left( \sum_{j=0}^{N-1} C_{j,k} n_{k-j} \right)^2 \right] \tag{28}$$

$$u_k = \left[ \left( \sum_{j=0}^{N-1} C_{j,k} n_{k-j} \right)^2 \right] \tag{29}$$

$$z_k = \left( \sum_{j=0}^{N-1} C_{j,k} n_{k-j} \right)^2 \tag{30}$$

$$y_k = \frac{z_k}{u_k} = \frac{\left( \sum_{j=0}^{N-1} C_{j,k} n_{k-j} \right)^2}{\left[ \left( \sum_{j=0}^{N-1} C_{j,k} n_{k-j} \right)^2 \right]} \tag{31}$$

$$u_k = \beta_1 \left( \sum_{j=0}^{N-1} C_{j,k} n_{k-j} \right)^2 + (1 - \beta_1) u_{k-1} \tag{32}$$

$$z_k = \beta_s \left( \sum_{j=0}^{N-1} C_{j,k} n_{k-j} \right)^2 + (1 - \beta_s) z_{k-1} \tag{33}$$

$$y_k = \frac{\beta_s \left( \sum_{j=0}^{N-1} C_{j,k} n_{k-j} \right)^2 + (1 - \beta_s) Z_{k-1}}{\beta_1 \left( \sum_{j=0}^{N-1} C_{j,k} n_{k-j} \right)^2 + (1 - \beta_1) u_{k-1}} \tag{34}$$

Other circuit operations are identical to those as described above by reference to FIG. 1 and no detailed descriptions will be given herein.

Figure 10:
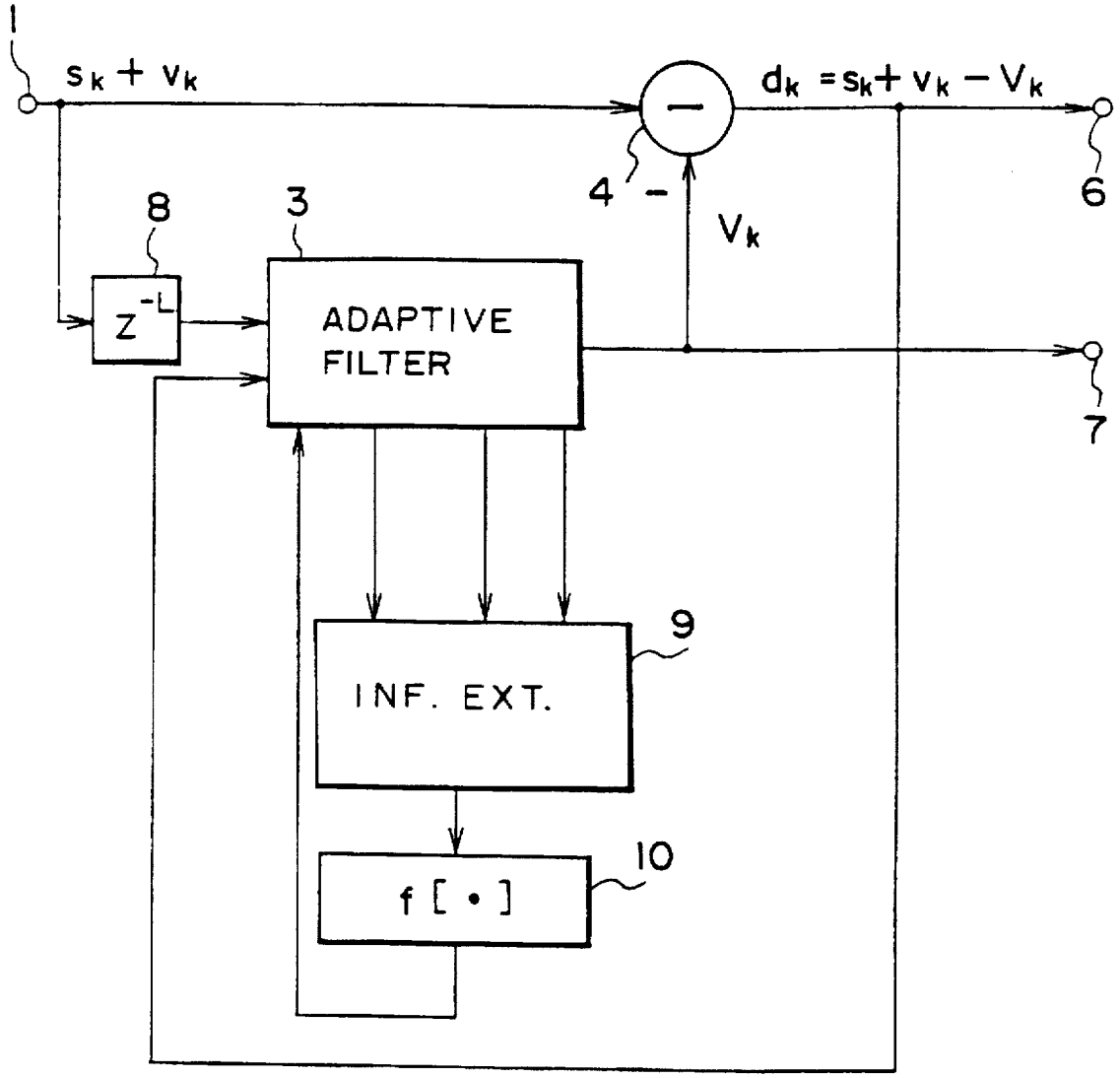
FIG. 10 is a block diagram of ALE according to the present invention corresponding to the noise canceller in FIG. 1.

Illustrated in FIG. 10 is a block diagram of the ALE according to the present invention corresponding to the noise canceller in FIG. 1. The mixed signal supplied to the input terminal 1 comprises a wideband signal $S_k$, a periodic signal $v_k$ and an additional noise $\delta_k$. Fed to the adaptive filter 3 is the mixed signal on the input terminal 1 delayed by the time L In the delay element 8, or the signal $u_{k-L}$ given by the equation (11). A predicted signal $V_k$ of $v_k$ as generated by the adaptive filter 3 is subtracted from the mixed signal $u_k$ to obtain the difference signal $d_k$ as given by the equation (2). Derived from output terminals 6 and 7 are the wideband signal with suppressed periodic interference signal and the periodic signal enhanced by suppressing the wideband noise. Coefficient correction of the adaptive filter 3 will be carried out in the exactly same manner as the embodiment in FIG. 1 using the filter coefficients.

Figure 11:
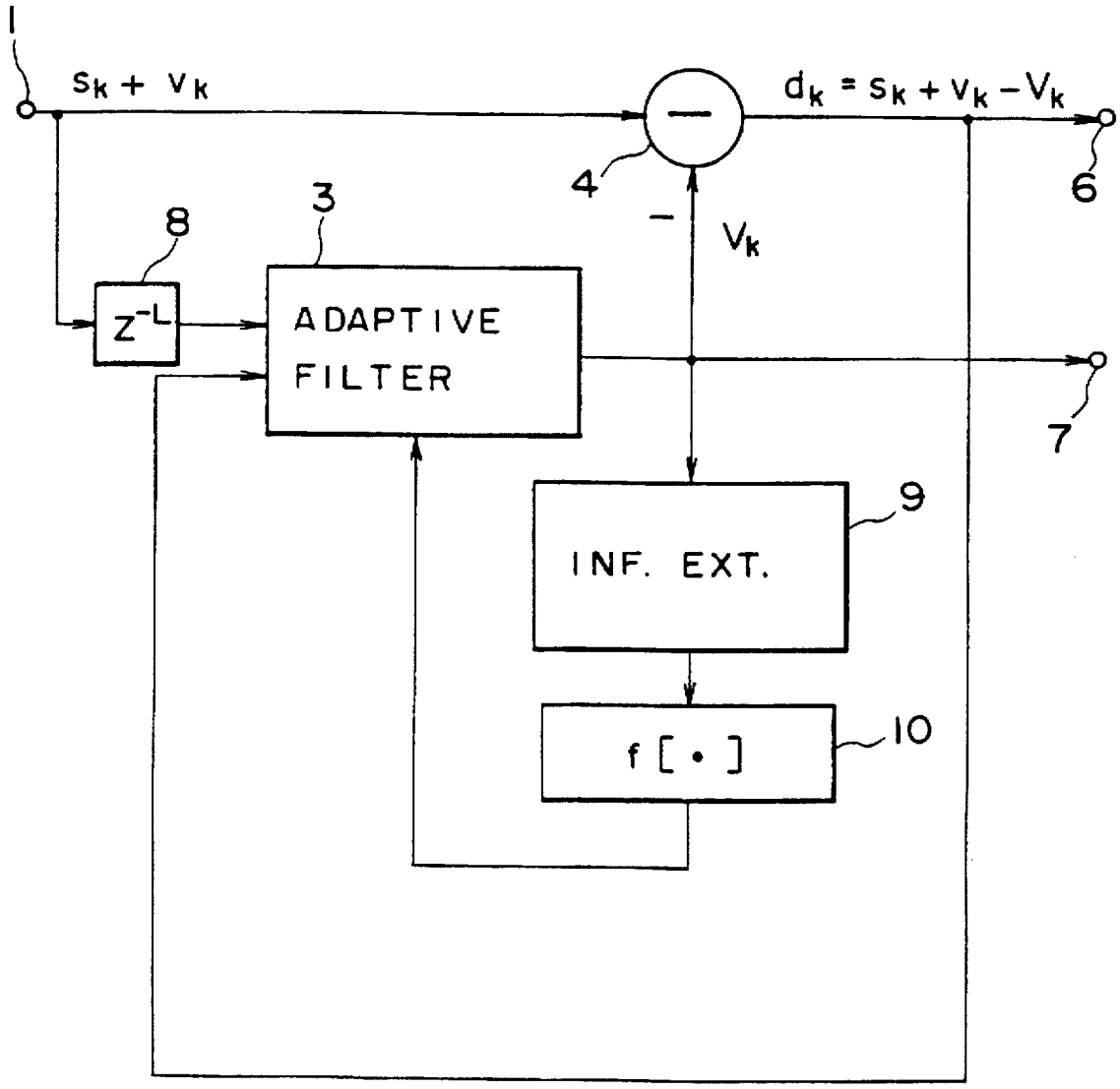
FIG. 11 is a block diagram of ALE according to the present invention corresponding to the noise canceller in FIG.2.

Illustrated in FIG. 11 is a block diagram of the ALE according to the present invention corresponding to the noise canceller in FIG. 9. The relationship between the embodiments in FIGS. 11 and 10 is equal to that between the embodiments in FIGS. 9 and 1, thereby requiring no detailed description of FIG. 11.

Figure 12:
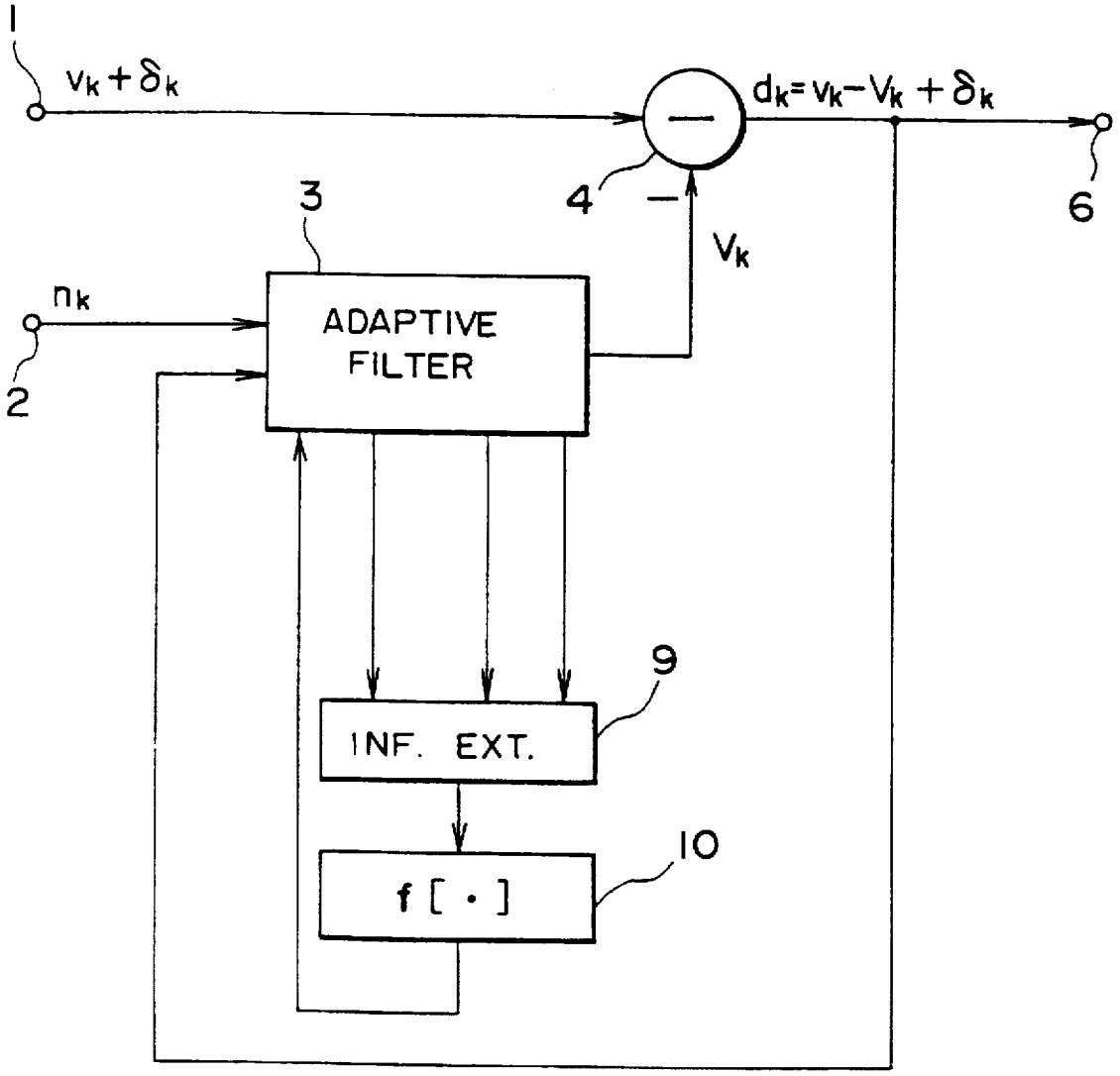
FIGS. 12 and 13 are block diagrams of applying the present invention to an echo canceller.
Figure 13:
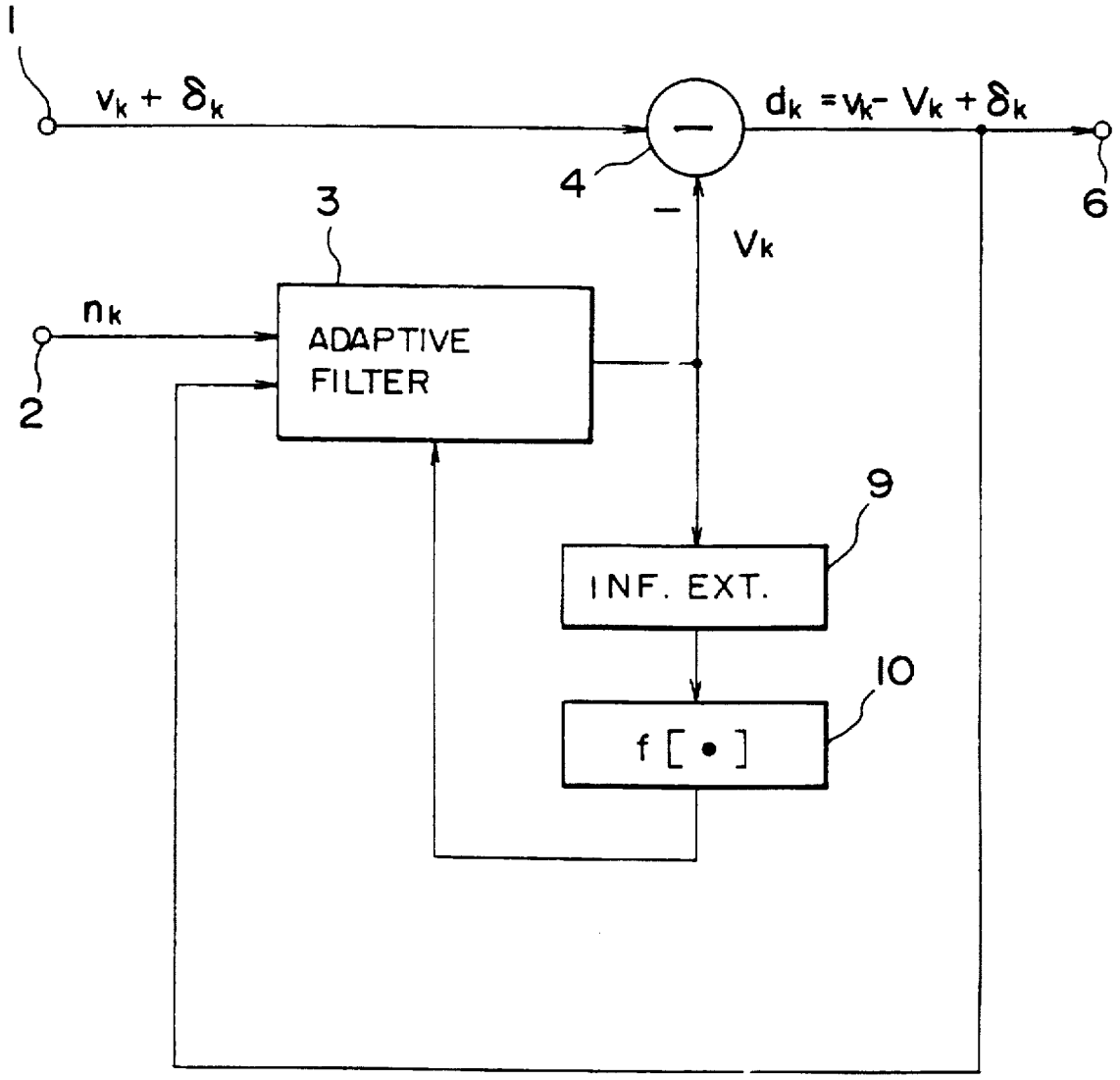

The present invention is also applicable to an echo canceller. Illustrated in FIGS. 12 and 13 are embodiments to apply the present invention to an echo canceller. FIGS. 12 and 13 are simply replacement of $S_k+v_k$ and $S_k+v_k-V_k$ by $v_k+\delta_k$ and $v_k-V_k+\delta_k$ in FIGS. 1 and 9. Accordingly, no detailed description will be given herein.

As described hereinbefore, a difference between LIM and LMS is the use of the step size μ divided by the average power $\sigma_n^2$ fed to the adaptive filter 3 instead of α. The method of varying the step size in the above description in connection with the present invention will be applied to LIM without any correction.

What is claimed is:

1. A method of controlling coefficients of an adaptive filter, said method comprising the steps of:

obtaining a mixed signal by combining an interference signal with an output signal from an unknown system;

obtaining an output signal generated by said adaptive filter, and subtracting said output signal generated by said adaptive filter from said mixed signal to obtain a difference signal;

obtaining a square value of the output signal generated by the adaptive filter, and utilizing said square value of the output signal of the adaptive filter as obtained information relating to magnitude of the coefficients of said adaptive filter; and adaptively varying corrections applied to the coefficients of said adaptive filter according to said obtained information.

2. A method as defined in claim 1, also comprising:

obtaining information relating to a short-time average magnitude and a long-time average magnitude of the coefficients of said adaptive filter and utilizing said information to obtain a ratio between said short-time average magnitude and said long-time average magnitude; wherein said step of adaptively varying corrections applied to the coefficients of said adaptive filter includes the step of adaptively varying the amount of the corrections applied to the coefficients of said adaptive filter according to the ratio between the short-time average magnitude and the long-time average magnitude of the coefficients of said adaptive filter.

3. A method of controlling coefficients of an adaptive filter, said method comprising the steps of:

obtaining a mixed signal by combining an interference signal with an output signal from an unknown system;

obtaining an output signal generated by said adaptive filter, and subtracting said output signal of said adaptive filter from said mixed signal to obtain a difference signal;

obtaining an absolute value of the output signal generated by the adaptive filter, and utilizing said absolute value of the output signal generated by the adaptive filter as obtained information relating to magnitude of the coefficients of said adaptive filter; and adaptively varying corrections applied to the coefficients of said adaptive filter according to said obtained information.

4. A method as defined in claim 3, also comprising:

obtaining information relating to a short-time average magnitude and a long-time average magnitude of the coefficients of said adaptive filter and utilizing said information to obtain a ratio between said short-time average magnitude and said long-time average magnitude; wherein said step of adaptively varying corrections applied to the coefficients of said adaptive filler includes the step of adaptively varying the amount of the corrections applied to the coefficients of said adaptive filter according to the ratio between the short-time average magnitude and the long-time average magnitude of the information on the magnitude of the output signal.

5. A method as defined in claim 4, wherein said step of utilizing said information to obtain the ratio between the short time average magnitude and long time average magnitude comprises the steps of inverting the long time average magnitude to obtain an inverted signal and multiplying the inverted signal by the short time average magnitude, wherein the step of inverting is made by a linear approximation of an exponent of 2.

6. A method as defined in claim 5, wherein the step of inverting includes the step of determining a variable X according to a linear approximation of $-2^{-2-r}X+2^{-r-1}(2^{-1}+1)$ using the maximum integer r not exceeding $\log_2(x)$.

7. Electronic filter apparatus comprising:

an adaptive filter which upon receiving a reference signal generates a pseudo output for an unknown system;

first means for generating a mixed signal from interference signals and an output signal of the unknown system;

a first subtracter for subtracting the pseudo output from said mixed signal;

an information extraction circuit that receives coefficients for the adaptive filter to extract the information on the magnitude of said coefficients and generate an output (a);

an arithmetic circuit to receive the output (a) for calculating and providing a signal (b) which decreases as the output (a) increases or increases as the output (a) decreases;

second means for correcting the coefficients of the adaptive filter utilizing the outputs from the first subtracter, said arithmetic circuit and the reference signal; and said information extraction circuit comprising a square circuit for developing the output of said adaptive filter.

8. Electronic filter apparatus as set forth in claim 7, wherein said arithmetic circuit comprises a first average circuit for averaging an input signal with a first parameter, a second average circuit for averaging the input signal with a second parameter that differs from the first parameter in said first average circuit, and a divider for developing a ratio of an output of said first average circuit and an output of said second average circuit.

9. Electronic filter apparatus as in claim 8 wherein said divider comprises an inverter for outputting an inverted signal of the output from said second average circuit and a first multiplier for multiplying the inverted signal with the output from said first average circuit.

10. Electronic filter apparatus as set forth in claim 7 wherein said information extraction circuit comprises additional square circuits which together with said square circuit form a group of square circuits each developing a squared value of each coefficient value; and a summer for developing a summed value of outputs of said group of square circuits.

11. Electronic filter apparatus as in claim 7 wherein said arithmetic circuit is an inverse circuit comprising:

an amplitude evaluation circuit to provide the maximum integer r not exceeding $\log_2(X)$ of an input signal X;

a second multiplier to multiply the output of said amplitude evaluation circuit by −1;

a second adder to add −1 to the out/put of said second multiplier;

a third adder to provide the sum of the outputs of said second multiplier and said second adder;

a first address generation circuit to provide a RAM address signal to give an exponent of 2 corresponding to the output of said third adder;

a second address generation circuit to provide a RAM address signal to give an exponent of 2 corresponding to the output of said second adder;

a RAM to provide a corresponding exponent output of 2 on receiving the outputs of said first and second address generation circuits;

a third multiplier to multiply the output corresponding to the address generated from said first address generation circuit in said RAM by −1;

a fourth multiplier to multiply the output of said third multiplier by the input signal to the input terminal;

a fifth multiplier to multiply the output corresponding to the address generated by said second address generation circuit in said RAM by 1.5; and a fourth adder to add the outputs of said fifth and fourth multipliers for outputting from the output terminal.

12. Electronic filter apparatus comprising:

an adaptive filter which upon receiving a reference signal generates a pseudo output for an unknown system;

first means for generating a mixed signal from interference signals and an output signal of the unknown system;

a first subtracter for subtracting the pseudo output from said mixed signal;

an information extraction circuit comprising a circuit that receives coefficients for the adaptive filter to extract the information on the magnitude of said coefficients and generate an output (a);

an arithmetic circuit to receive the output (a) for calculating and providing a signal (b) which decreases as the output (a) increases or increases as the output (a) decreases;

second means for correcting the coefficients of the adaptive filter utilizing the outputs from the first subtracter, said arithmetic circuit and the reference signal; and said information extraction circuit also comprising an absolute value circuit for developing an absolute value of the output of said adaptive filter.

13. Electronic filter apparatus as set forth in claim 12 wherein said information extraction circuit further comprises additional absolute value circuits which together with other portions of said information extraction circuit form a group of absolute value circuits each developing an absolute value of each coefficient value, and a first summer for developing a summed value of the outputs of said group of absolute value circuits.

14. Electronic filter apparatus comprising:

an adaptive filter which upon receiving a reference signal generates a pseudo output for an unknown system;

first means for generating a mixed signal from interference signals and an output signal of the unknown system;

a first subtracter for subtracting the pseudo output from said mixed signal;

an information extraction circuit that receives the output signal for the adaptive filter to extract the information on the magnitude of coefficients for the adaptive filter and generate an output (a);

an arithmetic circuit to receive the output (a) for calculating and providing a signal (b) which decreases as the output (a) increases or increases as the output (a) decreases;

second means for correcting the coefficients of the adaptive filter utilizing the outputs from the first subtracter, said arithmetic circuit and the reference signal; and said information extraction circuit comprising a square circuit for developing the output of said adaptive filter.

15. Electronic filter apparatus comprising:

an adaptive filter which upon receiving a reference signal generates a pseudo output for an unknown system;

first means for generating a mixed signal from interference signals and an output signal of the unknown system;

a first subtracter for subtracting the pseudo output from said mixed signal;

an information extraction circuit that receives the output signal of the adaptive filter to extract the information on the magnitude of coefficients for the adaptive filter and generate an output (a);

an arithmetic circuit to receive the output (a) for calculating and providing a signal (b) which decreases as the output (a) increases or increases as the output (a) decreases;

second means for correcting the coefficients of the adaptive filter utilizing the outputs from the first subtracter, said arithmetic circuit and the reference signal; and said information extraction circuit comprising an absolute value circuit for developing an absolute value of the output of said adaptive filter.

16. Electronic filter apparatus as set forth in claim 5, wherein said arithmetic circuit comprises a first average circuit for averaging an input signal with a first parameter, a second average circuit for averaging the input signal with a second parameter that differs from the first parameter in said first average circuit, and a divider for developing a ratio of an output of said first average circuit and an output of said second average circuit.

17. Electronic filter apparatus as in claim 15 wherein:

said arithmetic circuit comprises a first average circuit for averaging an input signal with a first parameter, a second average circuit for averaging the input signal with a second parameter that differs from the first parameter in said first average circuit, and a divider for developing a ratio of an output of said first average circuit and an output of second average circuit; and said divider comprises an inverter for outputting an inverted signal of the output from said second average circuit and a first multiplier for multiplying the inverted signal with the output from said first average circuit.

18. A method of controlling coefficients of an adaptive filter, said method comprising the steps of:

obtaining a mixed signal by combining an interference signal with an output signal from an unknown system;

obtaining an output signal generated by said adaptive filter, and subtracting said output signal generated by said adaptive filter from said mixed signal to obtain a difference signal;

obtaining a square value of the output signal generated by the adaptive filter, and utilizing said square value of the output signal generated by the adaptive filter as obtained information relating to magnitude of the output signal of said adaptive filter; and adaptively varying corrections applied to the coefficients of said adaptive filter according to said obtained information.

19. A method of controlling coefficients of an adaptive filter, said method comprising the steps of:

obtaining a mixed signal by combining an interference signal with an output signal from an unknown system;

obtaining an output signal generated by said adaptive filter, and subtracting said output signal generated by said adaptive filter from said mixed signal to obtain a difference signal;

obtaining an absolute value of the output signal generated by the adaptive filter, and utilizing an absolute value of the output signal generated by the adaptive filter as obtained information relating to magnitude of the output signal of said adaptive filter; and adaptively varying corrections applied to the coefficients of said adaptive filter according to said obtained information.

* * * * *